US011676759B2

(12) United States Patent
Yoon et al.

(10) Patent No.: US 11,676,759 B2
(45) Date of Patent: Jun. 13, 2023

(54) COIL COMPONENT

(71) Applicant: SAMSUNG ELECTRO-MECHANICS CO., LTD., Suwon-si (KR)

(72) Inventors: Chan Yoon, Suwon-si (KR); Dong Hwan Lee, Suwon-si (KR); Sang Soo Park, Suwon-si (KR); Hwi Dae Kim, Suwon-si (KR); Dong Jin Lee, Suwon-si (KR); Hye Mi Yoo, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 417 days.

(21) Appl. No.: 16/990,264

(22) Filed: Aug. 11, 2020

(65) Prior Publication Data

US 2021/0358684 A1 Nov. 18, 2021

(30) Foreign Application Priority Data

May 18, 2020 (KR) ........................ 10-2020-0058965

(51) Int. Cl.
*H01F 27/34* (2006.01)
*H01F 27/28* (2006.01)
(Continued)

(52) U.S. Cl.
CPC ......... *H01F 27/34* (2013.01); *H01F 27/2804* (2013.01); *H01F 27/29* (2013.01);
(Continued)

(58) Field of Classification Search
CPC ...... H01F 27/36; H01F 27/34; H01F 27/2804; H01F 27/29; H01F 27/32; H01F 41/041;
(Continued)

(56) References Cited

U.S. PATENT DOCUMENTS 10,204,741 B2 * 2/2019 Matsunaga ............ H03H 7/427
10,861,635 B2 * 12/2020 Matsunaga ........... H01F 27/245
(Continued)

FOREIGN PATENT DOCUMENTS

JP H0682843 U * 11/1994
JP 2002198490 A * 7/2002 ......... H01F 17/0006
(Continued)

*Primary Examiner* — Mohamad A Musleh
*Assistant Examiner* — Matthew T Sarles
(74) *Attorney, Agent, or Firm* — Morgan, Lewis & Bockius LLP

(57) ABSTRACT

A coil component includes a body, a support substrate disposed within the body, a coil portion disposed on the support substrate and having first and second lead-out portions exposed to respective surfaces of the body, a noise removal portion disposed within the body and spaced apart from the coil portion, and including a pattern portion forming an open loop and having a slit between one end portion thereof and another end portion thereof spaced apart from each other. The noise removal portion also includes a third lead-out portion connected to the pattern portion and having one surface exposed to a side surface of the body. An insulating layer is disposed between the coil portion and the noise removal portion, and first to third external electrodes are disposed on respective surfaces of the body and connected to the first to third lead-out portions, respectively.

33 Claims, 13 Drawing Sheets

(51) Int. Cl.
*H01F 27/32* (2006.01)
*H01F 41/04* (2006.01)
*H01F 27/29* (2006.01)

(52) U.S. Cl.
CPC .......... *H01F 27/32* (2013.01); *H01F 41/041* (2013.01); *H01F 2027/2809* (2013.01)

(58) Field of Classification Search
CPC ....... H01F 2027/2809; H01F 2017/008; H01F 2017/048; H01F 17/04; H01F 17/0013; H01F 27/33; H01F 27/306; H01F 27/292
See application file for complete search history.

(56) References Cited

U.S. PATENT DOCUMENTS

| | | | | |
|---|---|---|---|---|
| 11,315,719 | B2 * | 4/2022 | Yeo | H01F 17/04 |
| 11,443,894 | B2 * | 9/2022 | Lee | H01F 27/363 |
| 2002/0158306 | A1 * | 10/2002 | Niitsu | H01L 28/10 257/E21.022 |
| 2008/0149383 | A1 * | 6/2008 | Kaneko | H01L 23/49827 174/262 |
| 2014/0022041 | A1 * | 1/2014 | Park | H01F 5/00 336/199 |
| 2017/0063322 | A1 * | 3/2017 | Matsunaga | H01F 27/292 |
| 2019/0269015 | A1 | 8/2019 | Nakazawa | |

FOREIGN PATENT DOCUMENTS

| | | | | | |
|---|---|---|---|---|---|
| JP | 2006179596 | A | * | 7/2006 | |
| JP | 2008141070 | A | * | 6/2008 | H01L 21/4857 |
| JP | 2009200151 | A | * | 9/2009 | |
| JP | 2014022724 | A | * | 2/2014 | H01F 17/0013 |
| JP | 5517373 | B2 | | 4/2014 | |
| JP | 2017046169 | A | * | 3/2017 | H01F 17/0013 |
| JP | WO2018/092392 | A1 | | 5/2018 | |
| JP | 2018113432 | A | * | 7/2018 | H01F 3/04 |
| KR | 10/2017/0026135 | | * | 3/2017 | |
| WO | 2011/109158 | A1 | | 9/2011 | |

* cited by examiner

COIL COMPONENT

CROSS-REFERENCE TO RELATED APPLICATION(S)

This application claims benefit of priority to Korean Patent Application No. 10-2020-0058965 filed on May 18, 2020 in the Korean Intellectual Property Office, the disclosure of which is incorporated herein by reference in its entirety.

BACKGROUND

1. Field

The present disclosure relates to a coil component.

2. Description of Related Art

An inductor, a type of coil component, is a representative passive electronic component used in electronic devices, along with a resistor and a capacitor.

As electronic devices have been designed to have high performance and reduced sizes, an increased number of coil components have been used in electronic devices and sizes of coil components have been reduced.

For this reason, the demand for removing noise such as electromagnetic interference (EMI) of a coil component has increased.

SUMMARY

An aspect of the present disclosure is to provide a coil component in which noise may be easily removed by significantly reducing a path in which high frequency noise is removed up to an external electrode.

According to an aspect of the present disclosure, a coil component is provided, the coil component including a body having one surface and another surface opposing each other, one side surface and another side surface connecting the one surface to the other surface and opposing each other, and one end surface and another end surface connecting the one side surface to the other side surface and opposing each other. A support substrate is disposed within the body, and a coil portion is disposed on the support substrate, and has first and second lead-out portions exposed to the one end surface and the other end surface of the body, respectively. A noise removal portion is disposed within the body and spaced apart from the coil portion, and includes a pattern portion forming an open loop and having a slit between one end portion thereof and another end portion thereof spaced apart from each other, and a third lead-out portion is connected to the pattern portion and has one surface exposed to the one side surface of the body. An insulating layer is disposed between the coil portion and the noise removal portion, and first, second, and third external electrodes are respectively disposed on the one end surface, the other end surface, and the one side surface of the body, and respectively connected to the first, second, and third lead-out portions. In some examples, a distance from the other end portion of the pattern portion to the one side surface of the body is the same as or greater than a distance from the one end portion of the pattern portion to the other side surface of the body.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
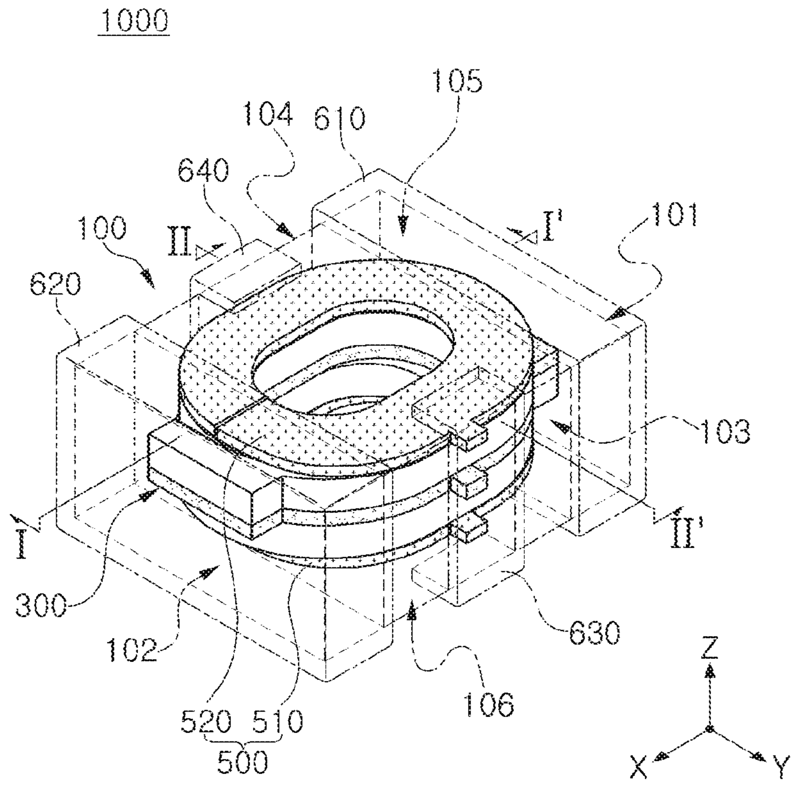
FIG. 1 is a schematic perspective diagram illustrating a coil component according to a first example embodiment of the present disclosure.

Hereinafter, embodiments of the present disclosure will be described as follows with reference to the attached drawings.

The terms used in the following description are provided to explain a specific exemplary embodiment and are not intended to be limiting. A singular term includes a plural form unless otherwise indicated. The terms, “include,” “comprise,” “is configured to,” etc. of the description are used to indicate the presence of features, numbers, steps, operations, elements, parts or combination thereof, and do not exclude the possibilities of combination or addition of one or more features, numbers, steps, operations, elements, parts or combination thereof. Also, the terms “disposed on,” “positioned on,” “mounted on,” and the like, may indicate that an element may be disposed on or below another element, and do not necessarily indicate that an element is only disposed within an upper portion with reference to a gravitational direction.

It will be understood that when an element is “coupled with/to” or “connected with” another element, the element may be directly coupled with/to another element, and/or there may be an intervening element between the element and another element.

Sizes and thicknesses of elements illustrated in the drawings are merely examples to help understanding of technical matters of the present disclosure.

In the drawings, an X direction is also referenced as a first direction or a length direction, a Y direction is also referenced as a second direction or a width direction, and a Z direction is also referenced as a third direction or a thickness direction.

In the drawings, same elements will be indicated by same reference numerals, and overlapping descriptions will not be provided.

In electronic devices, various types of electronic components may be used, and various types of coil components may be used between the electronic components to remove noise, and for other purposes.

In an electronic device, a coil component may be used as a power inductor, an HF inductor, a general bead, a GHz bead, a common mode filter, and the like.

First Example Embodiment and Modified Examples Thereof

Figure 2:
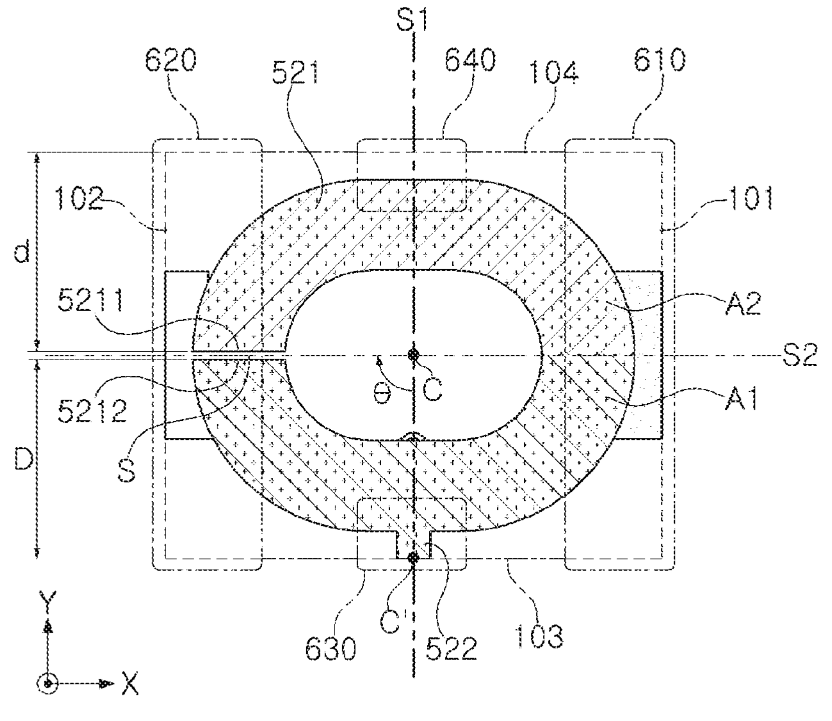
FIG. 2 is a schematic diagram illustrating the coil component illustrated in FIG. 1, viewed from above.
Figure 3:
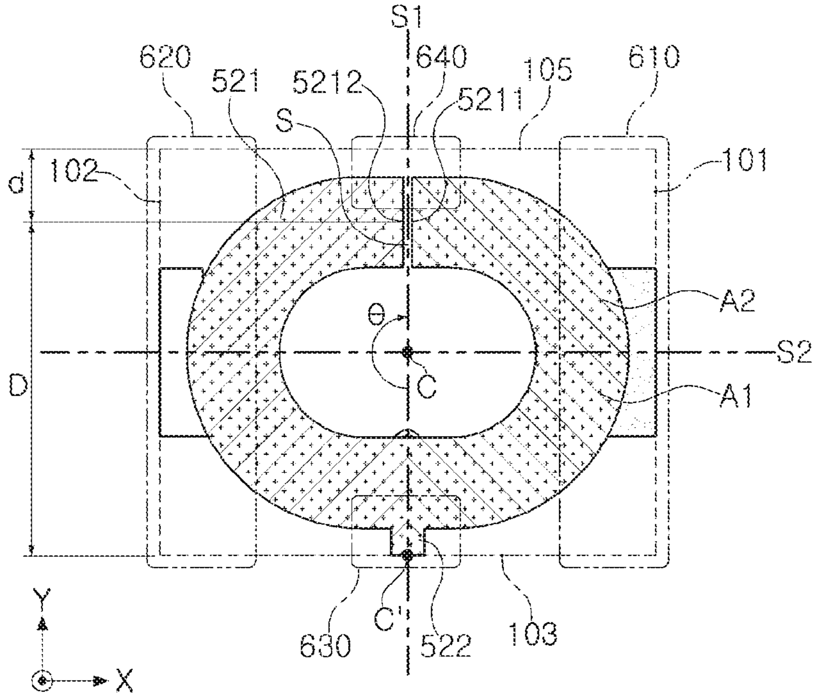
FIG. 3 is a schematic diagram illustrating another embodiment of the coil component illustrated in FIG. 1, viewed from above.
Figure 4:
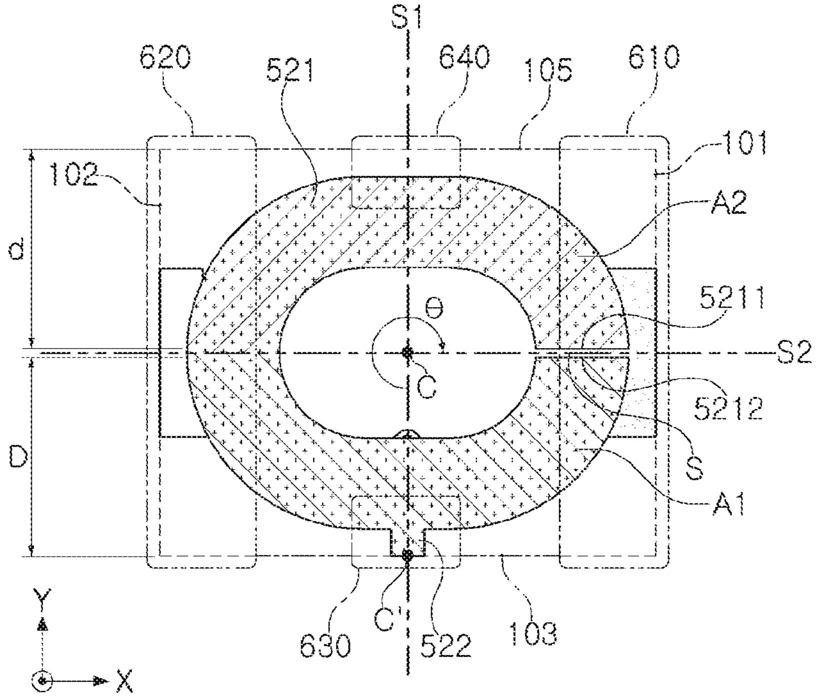
FIG. 4 is a schematic diagram illustrating another embodiment of the coil component illustrated in FIG. 1, viewed from above.
Figure 5:
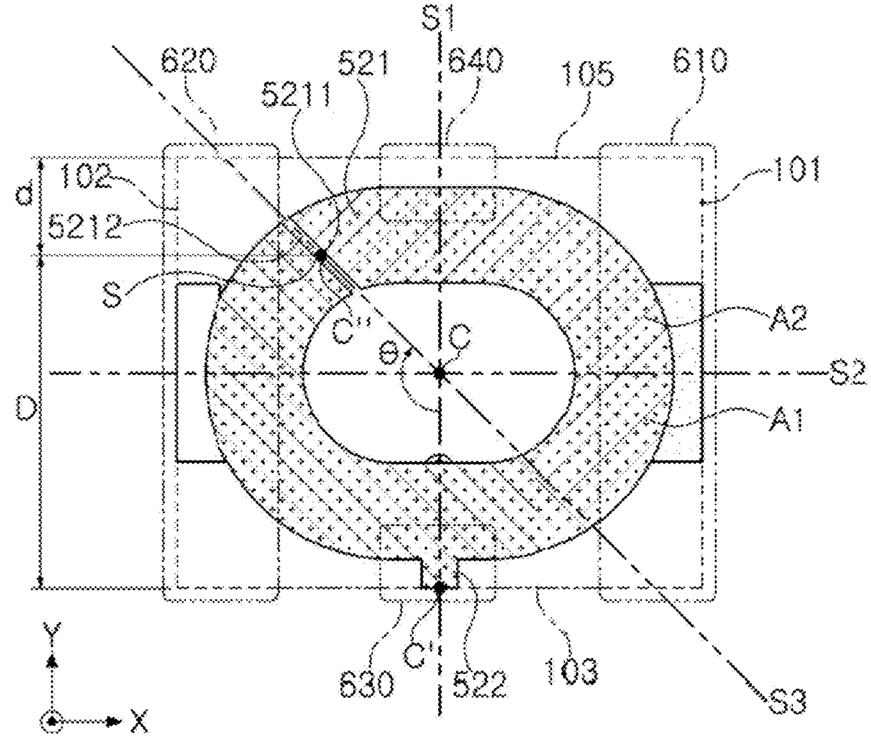
FIG. 5 is a schematic diagram illustrating another embodiment of the coil component illustrated in FIG. 1, viewed from above.
Figure 6:
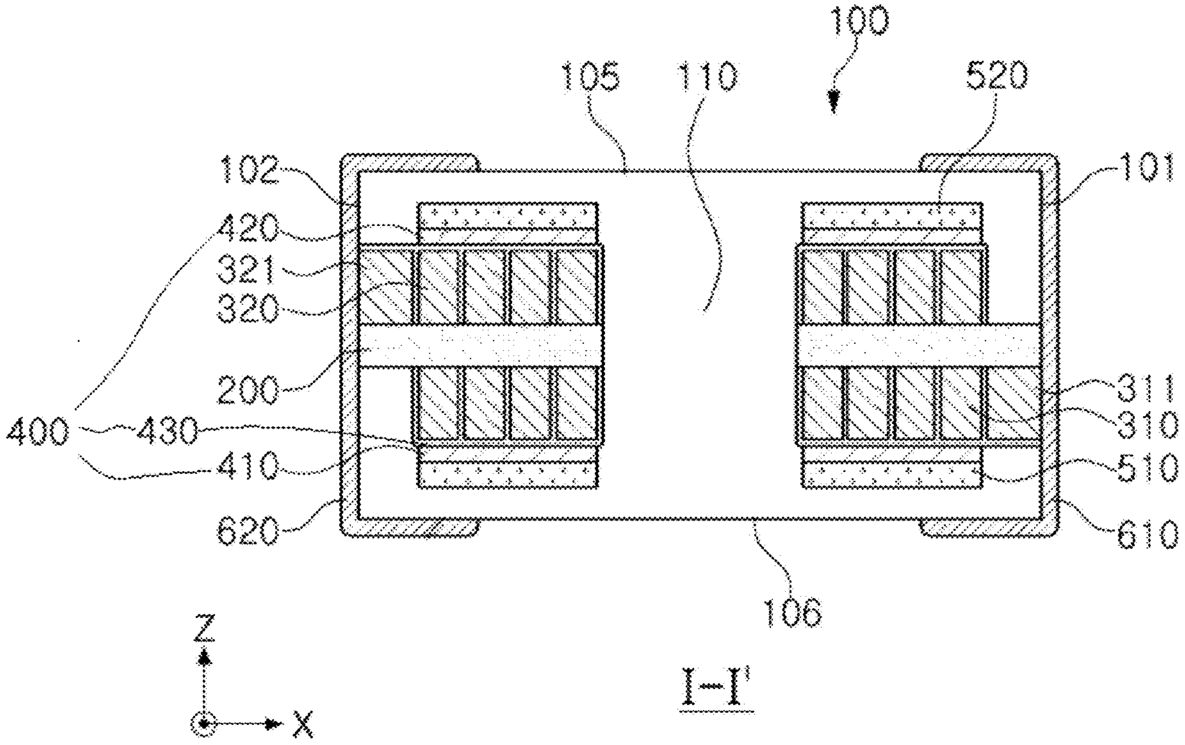
FIG. 6 is a cross-sectional diagram taken along line I-I' in FIG. 1.
Figure 7:
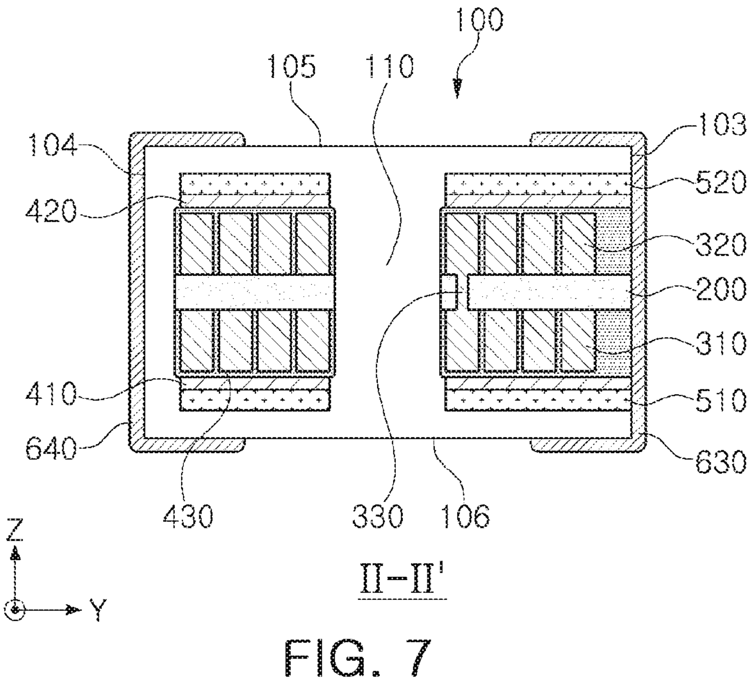
FIG. 7 is a cross-sectional diagram taken along line II-II' in FIG. 1.

FIG. 1 is a schematic perspective diagram illustrating a coil component according to a first example embodiment. FIG. 2 is a schematic diagram illustrating the coil component illustrated in FIG. 1, viewed from above. FIG. 3 is a schematic diagram illustrating the coil component illustrated in FIG. 1, viewed from above, corresponding to FIG. 2. FIG. 4 is a schematic diagram illustrating the coil component illustrated in FIG. 1, viewed from above, corresponding to FIG. 2. FIG. 5 is a schematic diagram illustrating the coil component illustrated in FIG. 1, viewed from above, corresponding to FIG. 2. FIG. 6 is a cross-sectional diagram taken along line I-I' in FIG. 1. FIG. 7 is a cross-sectional diagram taken along line II-II' in FIG. 1.

Referring to FIGS. 1 to 7, a coil component 1000 according to the first example embodiment may include a body 100, a support substrate 200, a coil portion 300, an insulating layer 400, a noise removal portion 500, and first to fourth external electrodes 610, 620, 630, and 640.

The body 100 may form an exterior of the coil component 1000, and may include the coil portion 300 disposed therein. The body 100 may have a hexahedral shape.

The body 100 may include a first surface 101 and a second surface 102 opposing each other in a length direction (X), a third surface 103 and a fourth surface 104 opposing each other in a width direction (Y), and a fifth surface 105 and a sixth surface 106 opposing each other in a thickness direction (Z). In the description below, both (or opposing) end surfaces of the body 100 may refer to the first surface 101 and the second surface 102, and both (or opposing) side surfaces of the body 100 may refer to the third surface 103 and the fourth surface 104. Also, one surface and the other (or other opposing) surface of the body 100 may refer to the fifth surface 105 and the sixth surface 106 of the body 100.

The body 100 may be configured such that the coil component 1000 including the external electrodes 610, 620, 630, and 640 disposed thereon may have a length of 2.0 mm, a width of 1.2 mm, and a thickness of 0.65 mm, but an example embodiment thereof is not limited thereto. The above-mentioned sizes are merely sizes of a design which does not reflect a process error, and a deviation from the range acknowledged as a process error may be included in the scope of the present invention.

The length, the width, and the thickness of the coil component 1000 may be measured by a micrometer measurement method. The micrometer measurement method may measure sizes by setting a zero point using a Gage repeatability and reproducibility (R&R) micrometer (apparatus), inserting the coil component 1000 to a space between tips of the micrometer, and turning a measurement level of the micrometer. When the length of the coil component 1000 is measured by the micrometer measurement method, the length of the coil component 1000 may refer to a value measured one time, or may refer to an arithmetic mean of values measured multiple times or at multiple different points on the coil component 1000. The same configuration may also be applied to the width and the thickness of the coil component 1000.

Alternatively, the length, the width, and the thickness of the coil component 1000 may be measured by a cross-section analysis. As an example, the length of the coil component 1000 obtained by the cross-section analysis may refer to, with reference to an image of a cross-sectional surface of the body 100 taken in the length direction (X)-thickness direction (Z) at a central portion of the body in the width direction (Y), obtained by an optical microscope or a scanning electron microscope (SEM), a maximum value of lengths of a plurality of segments parallel to the length direction X of the body 100 by connecting an outermost boundary line of the coil component 1000 illustrated in the cross-sectional image. Differently from the example above, the length of the coil component 1000 may refer to a minimum value of lengths of a plurality of segments parallel to the length direction X of the body 100 by connecting an outermost boundary line of the coil component 1000 illustrated in the cross-sectional image. Also, differently from the examples above, the length of the coil component 1000 may refer to an average value or arithmetic mean of a plurality of (e.g., at least three) segments parallel to the length direction X of the body 100 by connecting an outermost boundary line of the coil component 1000 illustrated in the cross-sectional image. The same description described above may also be applied to measurements of the width and the thickness of the coil component 1000.

The body 100 may include a magnetic material and resin. For example, the body 100 may be formed by layering one or more magnetic material sheets including resin and a magnetic material dispersed in resin. The body 100 may also have a structure different from the structure in which a magnetic material is disposed within resin. For example, the body 100 may be formed of a magnetic material such as ferrite.

The magnetic material may be ferrite powder or a magnetic metal powder.

The ferrite powder may be one or more of spinel ferrite such as Mg—Zn based ferrite, Mn—Zn based ferrite, Mn—Mg based ferrite, Cu—Zn based ferrite, Mg—Mn—Sr based ferrite, Ni—Zn based ferrite, and the like, hexagonal ferrite such as Ba—Zn based ferrite, Ba—Mg based ferrite, Ba—Ni based ferrite, Ba—Co based ferrite, Ba—Ni—Co based ferrite, and the like, garnet ferrite such as Y based ferrite, and Li based ferrite, for example.

The magnetic metal powder may include one or more selected from a group consisting of iron (Fe), silicon (Si), chromium (Cr), cobalt (Co), molybdenum (Mo), aluminum (Al), niobium (Nb), copper (Cu), and nickel (Ni). For example, the magnetic metal powder may be at least one or more of pure iron powder, Fe—Si based alloy powder, Fe—Si—Al based alloy powder, Fe—Ni based alloy powder, Fe—Ni—Mo based alloy powder, Fe—Ni—Mo—Cu based alloy powder, Fe—Co based alloy powder, Fe—Ni—Co based alloy powder, Fe—Cr based alloy powder, Fe—Cr—Si based alloy powder, Fe—Si—Cu—Nb based alloy powder, Fe—Ni—Cr based alloy powder, and Fe—Cr—Al based alloy powder.

The magnetic metal powder may be amorphous or crystalline. For example, the magnetic metal powder may be Fe—Si—B—Cr based amorphous alloy powder, but an example embodiment thereof is not limited thereto.

An average diameter of each of the ferrite powder and the magnetic metal powder may be 0.1 μm to 30 μm, but an example embodiment thereof is not limited thereto.

The body 100 may include two or more different types of magnetic materials disposed within resin. The notion that different types of magnetic materials may be included indicates that the magnetic materials may be distinguished from each other by one of an average diameter, a composition, crystallinity, and a shape.

Resin may include one of epoxy, polyimide, liquid crystal polymer, or the like, or combinations thereof, but an example embodiment thereof is not limited thereto.

For example, the body 100 may include a core 110 penetrating the coil portion 300 and the support substrate 200. The core 110 may be formed by filling a through-hole of the coil portion 300 with a magnetic composite sheet, but an example embodiment thereof is not limited thereto.

The support substrate 200 may be buried in the body 100. The support substrate 200 may support the coil portion 300.

The support substrate 200 may be formed of a thermosetting insulating resin such as an epoxy resin, a thermoplastic insulating resin such as a polyimide resin, or an insulating material including a photosensitive insulating resin, or may be formed of an insulating material including the above-mentioned insulating resins and a reinforcement such as glass fiber or an inorganic filler. For example, the support substrate 200 may be formed of an insulating material such as prepreg, Ajinomoto build-up film (ABF), FR-4, Bismaleimide Triazine (BT), a photoimageable dielectric (PID), or the like, but an example of the material may not be limited thereto.

As the inorganic filler, at least one or more elements selected from among a group consisting of silica ($SiO_2$), aluminum oxide ($Al_2O_3$), silicon carbide (SiC), barium sulfate ($BaSO_4$), talc, mud, mica powder, aluminum hydroxide ($AlOH_3$), magnesium hydroxide ($Mg(OH)_2$), calcium carbonate ($CaCO_3$), magnesium carbonate ($MgCO_3$), magnesium oxide (MgO), boron nitride (BN), aluminum borate ($AlBO_3$), barium titanate ($BaTiO_3$), and calcium zirconate ($CaZrO_3$) may be used.

When the support substrate 200 is formed of an insulating material including reinforcement, the support substrate 200 may provide improved stiffness. When the support substrate 200 is formed of an insulating material which does not include glass fiber, overall thicknesses of the coil portion 300 may be easily reduced.

The coil portion 300 may be buried in the body 100 and may exhibit properties of a coil component. For example, when the coil component 1000 in the example embodiment is used as a power inductor, the coil portion 300 may maintain an output voltage by storing an electrical field as a magnetic field, thereby stabilizing power of an electronic device.

The coil portion 300 may be disposed on at least one of both opposing main surfaces of the support substrate 200, and may form at least one turn. In the example embodiment, the coil portion 300 may include first and second coil patterns 310 and 320 formed on respective main surfaces of the support substrate 200 opposing each other in a thickness direction Z of the body 100, and a via 330 penetrating the support substrate 200 to connect the first and second coil patterns 310 and 320 to each other.

Each of the first coil pattern 310 and the second coil pattern 320 may have a planar spiral shape forming at least one turn about a core 110 as an axis. As an example, the first coil pattern 310 may form at least one turn about the core 110 as an axis on a lower surface of the support substrate 200, and the second coil pattern 320 may form at least one turn about the core 110 as an axis on an upper surface of the support substrate 200.

The first and second coil patterns 310 and 320 may be connected to first and second lead-out portions 311 and 321 and may be connected to the first and second external electrodes 610 and 620, respectively. In other words, as an example, the first lead-out portion 311 of the first coil pattern 310 may extend to be exposed to the first surface 101 of the body 100, and the second lead-out portion 321 of the second coil pattern 320 may extend to be exposed to the second surface 102 of the body 100 such that the first lead-out portion 311 and the second lead-out portion 321 may be in contact with and connected to the first and second external electrodes 610 and 620, respectively, formed on the first and second surfaces 101 and 102 of the body 100 respectively. In this case, the coil patterns 310 and 320 including the lead-out portions 311 and 321 may be integrated with each other.

At least one of the coil patterns 310 and 320 and the via 330 may include at least one or more conductive layers.

As an example, when the second coil pattern 320 and the via 330 are formed on a side of the other surface of the support substrate 200, each of the second coil pattern 320 and the via 330 may include a seed layer and an electrolytic plating layer. The seed layer may be formed by an electroless plating method or a vapor deposition method such as a sputtering method. Each of the seed layer and the electrolytic plating layer may have a single layer structure or a multilayer structure. The electrolytic plating layer having a multilayer structure may be formed in a conformal film structure in which an electrolytic plating layer is covered by another electrolytic plating layer, or a structure in which an electrolytic plating layer is only layered on one surface of one of the electrolytic plating layers. The seed layer of the second coil pattern 320 and the seed layer of the via 330 may be integrated with each other such that a boundary may not be formed therebetween, but an example embodiment thereof is not limited thereto. The electrolytic plating layer of the second coil pattern 320 and the electrolytic plating layer of the via 330 may be integrated with each other such that a boundary may not be formed therebetween, but an example embodiment thereof is not limited thereto.

The coil patterns 310 and 320 and the via 330 may be formed of a conductive material such as copper (Cu), aluminum (Al), silver (Ag), tin (Sn), gold (Au), nickel (Ni), lead (Pb), titanium (Ti), or alloys thereof, but an example of the material is not limited thereto.

The insulating layer 400 may include an insulating film 430 disposed along surfaces of the support substrate 200 and or the coil portion 300 and disposed between the coil portion 300 and the removing portion 500. For example, the insulating film 430 may be formed along surfaces of the first coil pattern 310, the support substrate 200, and the second coil pattern 320. The insulating film 430 may protect and insulate each of the coil patterns 310 and 320, and may include a generally used insulating material such as parylene. As for the insulating material included in the insulating film 430, any insulating material may be used, and the insulating material may not be limited to any particular material. The insulating film 430 may be formed by a method such as a vapor deposition, or the like, but the method is not limited thereto. Referring to FIG. 6, additional insulating layers 410 and 420 may be formed between the insulating film 430 and the noise removal portion 500. When the insulating film 430 is formed on surfaces of the coil patterns 310 and 320, it may be difficult to uniformly form a surface of the insulating film 430 due to a deviation in heights between the coil patterns 310 and 320 and the support substrate 200. Accordingly, surfaces of noise removing patterns 510 and 520 may also be non-uniformly formed such that a noise removing function may degrade. When the additional insulating layers 410 and 420 are additionally disposed on the insulating film 430 as in the example embodiment, a deviation in thickness of the noise removal portion 500 may be reduced such that a noise removing function of the coil component may further be intensified.

Referring to FIGS. 6 to 9, the insulating layer 400 may further include the first and second additional insulating layers 410 and 420 disposed between the insulating film 430 and the noise removal portion 500. In the example embodiment, the first additional insulating layer 410 may be disposed on the first coil pattern 310 and may be disposed between the first coil pattern 310 and a first noise removing pattern 510. The second additional insulating layer 420 may be disposed on the second coil pattern 320 and may be disposed between the second coil pattern 320 and a second noise removing pattern 520.

The first and second additional insulating layers 410 and 420 may be formed by stacking insulating films on the first and second coil patterns 310 and 320 on which the insulating film 430 is formed. The insulating film may be a generally used non-photosensitive insulating film such as an Ajinomoto build-up film, prepreg, or the like, or may be a photosensitive insulating film such as a PID. The first and second additional insulating layers 410 and 420, along with the insulating film 430, may work as dielectric layers when the coil patterns 310 and 320 of the coil portion 300 are capacitive-coupled with the noise removing patterns 510 and 520 of the noise removal portion 500.

The noise removal portion 500 may be disposed within the body 100 to remove noise transferred to a component and/or noise generated from the components to a mounting substrate, or the like. For example, the noise removal portion 500 may be buried in the body 100 and disposed on the coil portion 300, and may form an open loop such that one end thereof may be exposed to a surface of the body 100. In the example embodiment, the first noise removing pattern 510 may be disposed within the body 100 on the first additional insulating layer 410 and may be disposed on the first coil pattern 310, and the second noise removing pattern 520 may be disposed on the second additional insulating layer 420 and may be disposed on the second coil pattern 320. The noise removal portion 500 may be capacitive-coupled with the coil portion 300 by means of the insulating layers 410 and 420.

The noise removal portion 500 may form an open loop. For example, the first noise removing pattern 510 may include a first pattern portion of which one end portion and the other end portion are spaced apart from each other and form an open loop, and a fourth lead-out portion connected to the first pattern portion and having one surface exposed to the third surface 103 of the body 100. The second noise removing pattern 520 may include a second pattern portion 521 of which one end portion 5211 and the other end portion 5212 are spaced apart from each other and form an open loop, and a third lead-out portion 522 connected to the second pattern portion 521 and having one surface exposed to the third surface 103 of the body 100. Accordingly, in the example embodiment, a slit S may be formed between the one end portion and the other end portion of the first pattern portion and between the one end portion 5211 and the other end portion 5212 of the second pattern portion 521. An open loop in the example embodiment may refer to a shape in which the noise removal portion 500 does not forma complete closed loop. A shape of the open loop may not be limited to any particular shape as along as at least one of the one end portions (e.g., 5211) and of the other end portions (e.g., 5212) of the pattern portions (e.g., 521) of each noise removing pattern 510 and 520 are spaced apart from each other to include a non-circular path. Also, the slit S may refer to a structure for forming an open loop for the one end portions 5211 and the other end portions 5212 of the pattern portions 521 to be spaced apart from each other to form an open loop. Accordingly, the slit S may refer to a three-dimensional space which may allow the one end portions 5211 and the other end portions 5212 of the pattern portions 521 of each noise removing pattern 510 and 520 to be physically spaced apart from each other such that at least one region of the pattern portions 521 of the noise removal portion 500 may not form a complete closed loop. The slit S may include a linear structure or a curved structure, and may have a shape in which the slit S may or may not completely penetrate the pattern portions 521, and the shape is not limited to any particular shape. In the example embodiment, the first and second pattern portions 521 may form a turn to correspond to each of the first and second coil patterns 310 and 320, and may have a ring shape in which the slit S is formed.

Referring to FIG. 2, a distance D from the other end portion 5212 of the second pattern portion 521 to the third surface 103 of the body 100 may be the same as or greater than a distance d from the one end portion 5211 of the second pattern portion 521 to the fourth surface 104 of the body 100. Accordingly, the slit S may be disposed more adjacent to the fourth surface 104 side of the body 100 than the third surface 103 side of the body 100. In the example embodiment, a surface crossing a center C of an open loop and a center C' of one surface of the third lead-out portion 522 may be defined as a first virtual surface S1, and a surface perpendicular to the first virtual surface S1 and crossing a center C of the open loop may be defined as a second virtual surface S2. In the example embodiment, the distance D from the other end portion 5212 of the second pattern portion 521 may refer to a shortest distance from a center of the other end portion 5212 of the second pattern portion 521 to the third surface 103 of the body 100. Also, the distance d from the one end portion 5211 of the second pattern portion 521 to the fourth surface 104 of the body 100 may refer to a shortest distance from a center of the one end portion 5211 of the second pattern portion 521 to the fourth surface 104 of the body 100. Referring to FIG. 2, the noise removal portion 500 may be divided into a first region A1 and a second region A2 separated from each other by the second virtual surface S2, where the first region A1 is connected to (and includes) the third lead-out portion 522 and the second region A2 is the region other than the first region A1. Accordingly, the one end portion 5211 of the second pattern portion 521 may be disposed within the second region A2 such that the distance D from the other end portion 5212 of the second pattern portion 521 to the third surface 103 of the body 100 may be the same as the distance d from the one end portion 5211 of the second pattern portion 521 to the fourth surface 104 of the body 100. Referring to FIGS. 3 to 5, the one end portion 5211 of the second pattern portion 521 may be disposed within the second region A2 such that the distance D from the other end portion 5212 of the second pattern portion 521 to the third surface 103 of the body 100 may be greater than the distance d from the one end portion 5211 of the second pattern portion 521 to the fourth surface 104 of the body 100. Also, in the example embodiment, a surface crossing a center C" of a spacing between the one end portion 5211 and the other end portion 5212 of the second pattern portion 521 and crossing a center C of the open loop may be referred to as a third virtual surface S3. Meanwhile, a center of a spacing between the one end portion 5211 and the other end portion 5212 of the second pattern portion 521 may refer to a center of the slit S. Thus, in FIGS. 2 to 5, the third virtual surface S3 may refer to a surface crossing the center of the slit S and the center C of the open loop. Accordingly, a surface crossing a center of the spacing mentioned above and the center C of the open loop may match the second virtual surface S2 (see, e.g., FIGS. 2 and 4). In FIG. 3, a surface crossing the center of the spacing mentioned above and the center C of the open loop may match the first virtual surface S1. Referring to FIG. 5, the one end portion 5211 of the second pattern portion 521 may be disposed within a position in which an angle θ formed by the first virtual surface S1 and the third virtual surface S3 is 90° or greater and 270° or less in a clockwise direction with reference to the first virtual surface S1 disposed within the first region A1. Referring to FIG. 2, the one end portion 5211 of the second pattern portion 521 may be disposed within a position in which an angle θ formed by the first virtual surface S1 and the second virtual surface S2 is 90° in a clockwise direction with reference to the first virtual surface S1 disposed within the first region A1. Accordingly, the slit S may be formed in a position of ¼ of a turn in a clockwise direction with reference to the third lead-out portion 522. Referring to FIG. 3, the one end portion 5211 of the second pattern portion 521 may be disposed within a position in which an angle θ formed by the first virtual surface S1 disposed within the first region A1 and the first virtual surface S1 disposed within the second region A1 is 180° in a clockwise direction with reference to the first virtual surface S1 disposed within the first region A1. Accordingly, the slit S may be formed in a position of ½ of a turn in a clockwise direction with reference to the third lead-out portion 522. Referring to FIG. 4, the one end portion 5211 of the second pattern portion 521 may be disposed within a position in which an angle θ formed by the first virtual surface S1 and the second virtual surface S2 is 270° in a clockwise direction with reference to the first virtual surface S1 disposed within the first region A1. Accordingly, the slit S may be formed in a position of ¾ of a turn in a clockwise direction with reference to the third lead-out portion 522. Although not illustrated in the diagram, the slit S in the example embodiment may be formed in parallel to a direction in which the third lead-out portion 522 extends, in a direction parallel to the first virtual surface S1.

Figure 21:
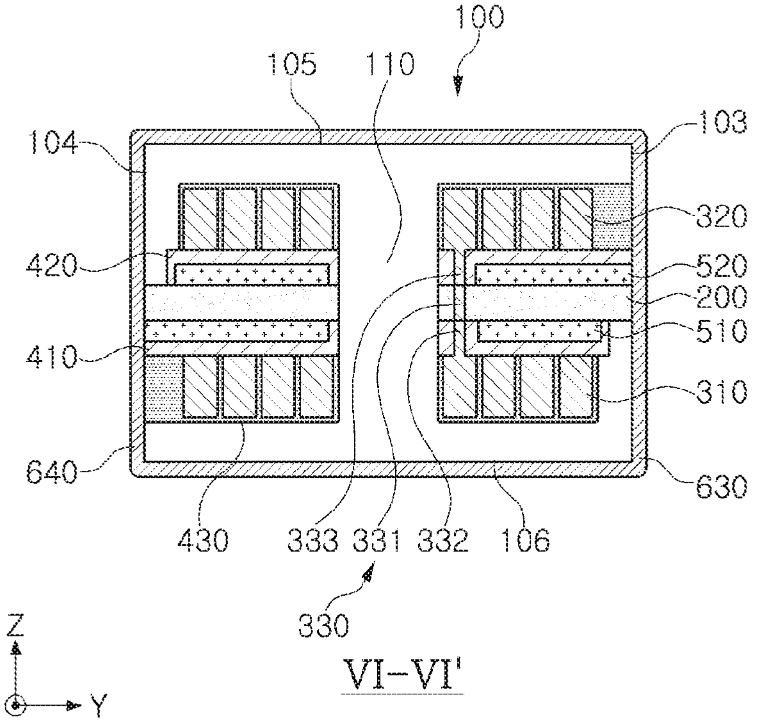
FIG. 21 is a schematic diagram illustrating a coil component according to a first modified example of the fourth example embodiment, corresponding to the cross-sectional surface taken along line VI-VI' in FIG. 19.
Figure 22:
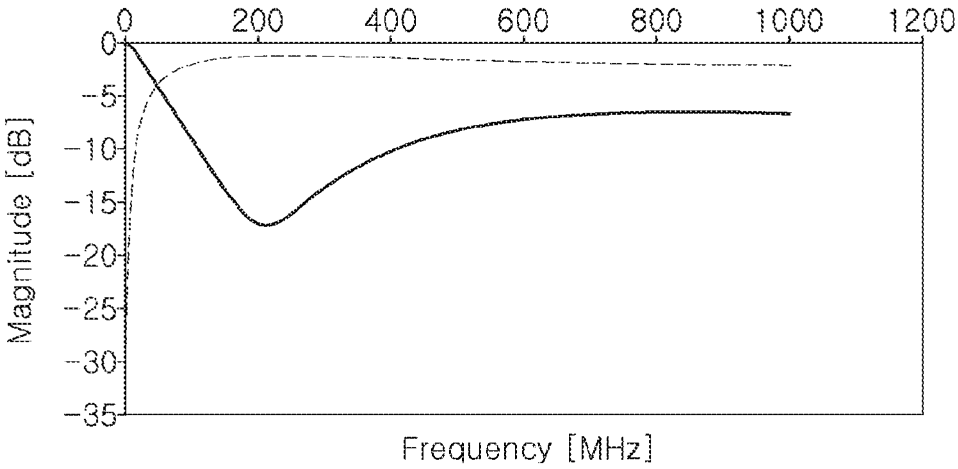
FIG. 22 is a diagram illustrating signal transfer properties (S-parameters) of a coil component including a closed loop type noise removal portion.
Figure 23:
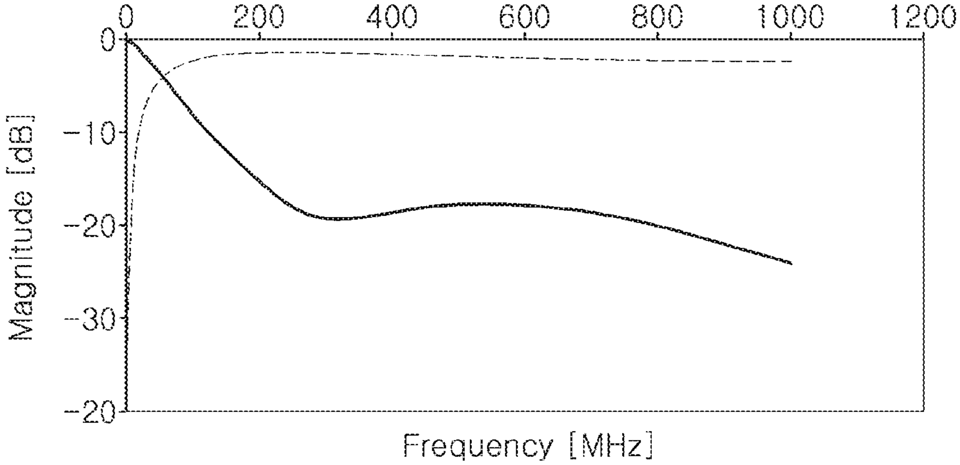
FIG. 23 is a diagram illustrating signal transfer properties (S-parameters) of a general coil component.
Figure 24:
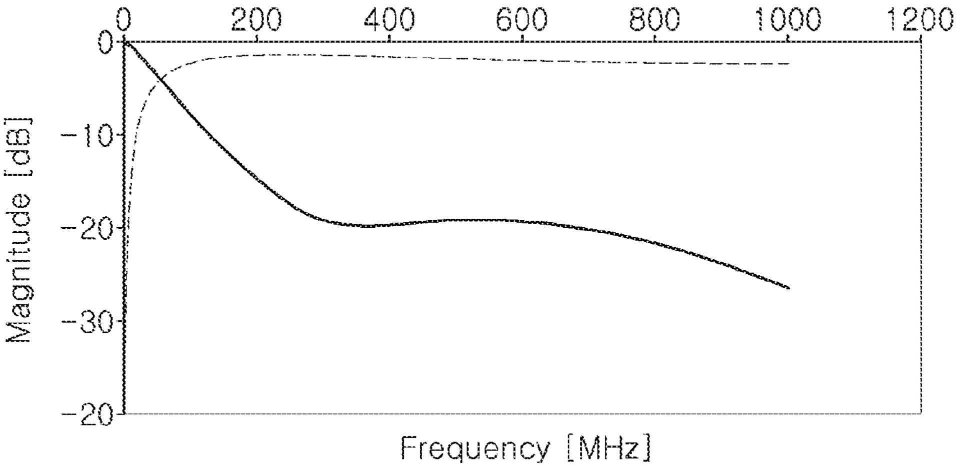
FIG. 24 is a diagram illustrating signal transfer properties (S-parameters) of a coil component according to a first example embodiment.

FIG. 22 is a diagram illustrating signal transfer properties (S-parameters) of a coil component including a closed loop type noise removal portion. FIG. 23 is a diagram illustrating signal transfer properties (S-parameters) of a general coil component. FIG. 24 is a diagram illustrating signal transfer properties (S-parameters) of a coil component according to a first example embodiment. In FIGS. 21, 22, and 23, a dotted line indicates an input reflective coefficient, S11, and a solid line indicates a coefficient of transmission from an input terminal to an output terminal. Referring to FIG. 22, when the noise removal portion forms a closed loop, differently from the example embodiment, noise may not be externally removed such that a noise removing effect may be relatively low. FIG. 23 illustrates signal transfer properties of a general coil component in which the one end portion 5211 of the second pattern portion 521 is disposed within a position in which an angle θ formed by the first virtual surface S1 and the third virtual surface S3 is 0° in a clockwise direction with reference to the first virtual surface S1 disposed within the first region A1. Accordingly, referring to FIG. 23, a coil component in which the one end portion 5211 of the second pattern portion 521 is disposed within the second region A2 may easily pass a signal of a low frequency from a direct current, but a noise removing effect may rapidly degrade in a frequency higher than a self-resonant frequency (SRF). Differently from the above-described example, referring to FIG. 24, a coil component in which the element is disposed within a position in which the above-described angle θ is disposed within a position of 180° in a clockwise direction may relatively easily pass a signal of a low frequency from a direct current, and may effectively block unnecessary noise of a higher frequency, as compared to a general coil component. Table 1 indicates a result of experiments in which signal transfer properties S21 of a coil component was measured according to the above-described angle θ when a frequency is 600 MHz. Referring to Table 1, when the element is disposed within a position in which above-described angle θ of the one end portion 5211 of the second pattern portion 521 is 180°, high frequency noise removing properties was the most effective, and the high frequency noise removing properties rapidly degrade in positions where the angle θ is 45° and 135°. In the position in which the above-described angle θ was 180°, a path on the second pattern portion 521 in which noise is removed was ½ of a turn of the second pattern portion 521, which was the shortest, such that noise may be effectively removed. In the position in which the above-described angle θ was 45° or 135°, which were beyond the range of 90° or greater and 270° or less, as a path on the second pattern portion 521 in which noise is removed became ¾ of a turn of the second pattern portion 521 such that the noise removing effect decreased. In the example embodiment, only the example of the second pattern portion 521 is described for ease of description, but the same description may also be applied to the first pattern portion.

TABLE 1

| Angle (θ) | Signal Transfer Properties ($S_{21}$) at 600 MHz |
|---|---|
| 0° | −17.89 dB |
| 45° | −18.10 dB |
| 90° | −18.9 dB |
| 135° | −19.24 dB |
| 180° | −19.39 dB |
| 225 | −19.23 dB |
| 270 | −18.89 dB |
| 315 | −18.12 dB |

The third lead-out portion 522 may be exposed to the third surface 103 of the body 100. For example, the second noise removing pattern 520 may include the third lead-out portion 522 connected to the second pattern portion 521 and exposed to the third surface 103 of the body 100, and the first noise removing pattern 510 may include the fourth lead-out portion connected to the first pattern portion and exposed to the third surface 103 of the body 100 to be spaced apart from the third lead-out portion 522. The third lead-out portion 522 may be in contact with and connected to the third external electrode 630 disposed on the third surface 103 of the body 100. In the example embodiment, the fourth lead-out portion may be exposed to the third surface 103 of the body 100 and may be connected to the third external electrode 630. The third external electrode 630 may be connected to a ground of the mounting substrate when the coil component 1000 is mounted on the mounting substrate, or when the coil component 1000 is packaged in an electronic component package, the third external electrode 630 may be connected to a ground of the electronic component package. In the example embodiment, the fourth external electrode 640 disposed on the fourth surface 104 of the body 100 may be included, and the fourth external electrode 640 may be used as a non-contact terminal in the example embodiment and may be connected to a ground such as a mounting substrate or may be connected to a ground of a package. High frequency noise may refer to a signal of a frequency exceeding an upper limit of a frequency range determined as an operational frequency in designing of the coil component 1000. As an example, although not limited thereto, an upper limit of a range determined as an operational frequency of the coil component 1000 in the example embodiment may be about 600 MHz.

The noise removing patterns 510 and 520 may be formed of copper (Cu), aluminum (Al), silver (Ag), tin (Sn), gold (Au), nickel (Ni), lead (Pb), titanium (Ti), or alloys thereof, but an example embodiment thereof is not limited thereto. The noise removing patterns 510 and 520 and the slit S may be formed by a method including at least one of an electroless plating method, an electrolytic plating method, a vapor deposition method such as a sputtering method, and an etching method, but the method is not limited thereto.

The first and second external electrodes 610 and 620 may be disposed on the first and second surfaces 101 and 102 of the body 100, respectively, and may be connected to the first and second coil patterns 310 and 320, respectively. In other words, referring to FIG. 6, the first external electrode 610 may be in contact with and connected to the first lead-out portion 311 disposed on the first surface 101 of the body 100 and exposed to the first surface 101 of the body 100. The second external electrode 620 may be connected to the second lead-out portion 321 disposed on the second surface 102 of the body 100 and exposed to the second surface 102 of the body 100. The first and second external electrodes 610 and 620 may extend from the first and second surfaces 101 and 102 of the body 100, respectively, to the sixth surface 106 of the body 100. Also, the first and second external electrodes 610 and 620 may extend from the first and second surfaces 101 and 102 of the body 100, respectively, to portions of the third, fourth, and fifth surfaces 103, 104, and 105 of the body 100. The shapes of the first and second external electrodes 610 and 620 in FIG. 1 and other diagrams are merely examples, and the first and second external electrodes 610 and 620 may have various shapes such as a shape which do not partially extend to the third, fourth, and fifth surfaces 103, 104, and 105 of the body 100, an L-shape, for example.

The first and second external electrodes 610 and 620 may electrically connect the coil component 1000 to amounting substrate when the coil component 1000 is mounted on amounting substrate such as a printed circuit board, or the like. As an example, the coil component 1000 in the example embodiment may be mounted such that the sixth surface 106 of the body 100 may face an upper surface, and the first and second external electrodes 610 and 620 extending to the sixth surface 106 of the body 100 and a connection portion of the printed circuit board may be electrically connected to each other by a conductive coupling member such as solder, or the like.

The first to fourth external electrodes 610, 620, 630, and 640 may include at least one of a conductive resin layer and an electrolytic plating layer. The conductive resin layer may be formed by a paste printing process, or the like, and may include at least one or more conductive metals selected from a group consisting of copper (Cu), nickel (Ni), and silver (Ag), and a thermosetting resin. The electrolytic plating layer may include at least one or more selected from a group consisting of nickel (Ni), copper (Cu), and tin (Sn).

Figure 8:
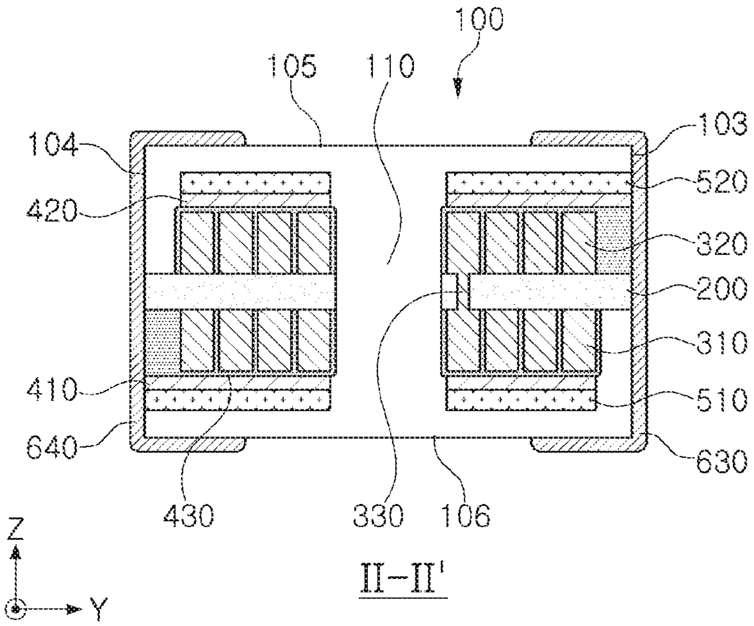
FIG. 8 is a schematic diagram illustrating a coil component according to a first modified example of the first example embodiment, corresponding to the cross-sectional surface taken along line II-II' in FIG. 1.
Figure 9:
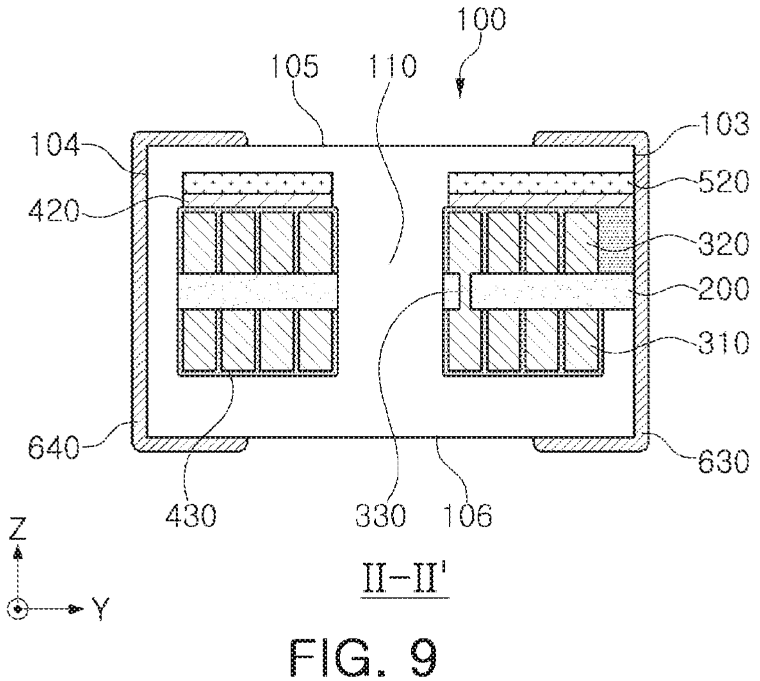
FIG. 9 is a schematic diagram illustrating a coil component according to a second modified example of the first example embodiment, corresponding to the cross-sectional surface taken along line II-II' in FIG. 1.
Figure 10:
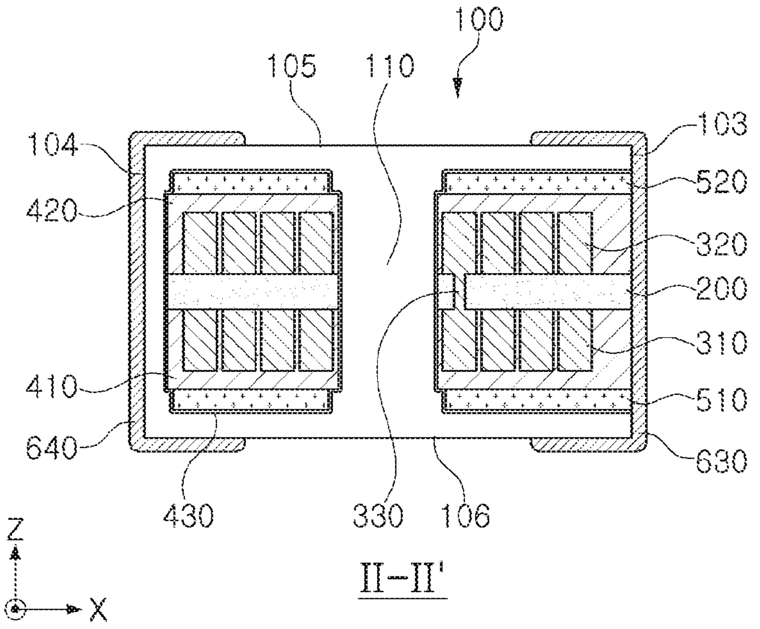
FIG. 10 is a schematic diagram illustrating a coil component according to a third modified example of the first example embodiment, corresponding to the cross-sectional surface taken along line II-II' in FIG. 1.

FIG. 8 is a schematic diagram illustrating a coil component according to a first modified example of the first example embodiment, corresponding to the cross-sectional surface taken along line II-II' in FIG. 1. FIG. 9 is a schematic diagram illustrating a coil component according to a second modified example of the first example embodiment, corresponding to the cross-sectional surface taken along line II-II' in FIG. 1. FIG. 10 is a schematic diagram illustrating a coil component according to a third modified example of the first example embodiment, corresponding to the cross-sectional surface taken along line II-II' in FIG. 1.

Referring to FIG. 8, in the first modified example of the example embodiment, a fourth lead-out portion of a first noise removing pattern 510 may be exposed to the fourth surface 104 of the body 100, and a third lead-out portion 522 of a second noise removing pattern 520 may be exposed to the third surface 103 of the body 100. The fourth lead-out portion of the first noise removing pattern 510 may be in contact with and connected to a fourth external electrode 640 disposed on the fourth surface 104 of the body 100, and the third lead-out portion 522 of the second noise removing pattern 520 may be in contact with and connected to the third external electrode 630 disposed on the third surface 103 of the body 100. Thus, in the example embodiment, even when one of the third and fourth external electrodes 630 and 640 is disconnected from a mounting substrate, noise may be removed.

Referring to FIG. 9, in the second modified example of the example embodiment, the noise removal portion 500 may only be disposed on the second coil pattern 320. When it is not necessary to remove noise, by selectively forming the noise removal portion on only one of both surfaces of a support substrate 200, material costs may decrease, and a ratio of a magnetic material in a component having the same size may increase such that component properties may improve.

Referring to FIG. 10, in the third modified example of the example embodiment, additional insulating layers 410 and 420 may be disposed along surfaces of the support substrate 200, the coil portion 300, and the noise removal portion 500 and may be disposed between the coil portion 300 and the noise removal portion 500. The insulating film 430 may be formed along surfaces of the support substrate 200, the coil patterns 310 and 320, the insulating layers 410 and 420, and the noise removing patterns 510 and 520. In the modified example, the time point in a manufacturing process at which the insulating film 430 is formed may be different from the time point at which the insulating film 430 is formed in a manufacturing process of the first example embodiment. In the modified example, the coil patterns 310 and 320, the insulating layers 410 and 420, and the noise removing patterns 510 and 520 may be formed on the support substrate 200, a trimming process may be performed, and after the trimming, the insulating film 430 may be formed. Also, in the modified example, the number of trimming processes performed may be reduced as compared to the aforementioned example embodiment. Also, electrical short between the noise removal portion 500 including a conductive material and the body 100 may be prevented.

Second Example Embodiment and Modified Examples Thereof

Figure 11:
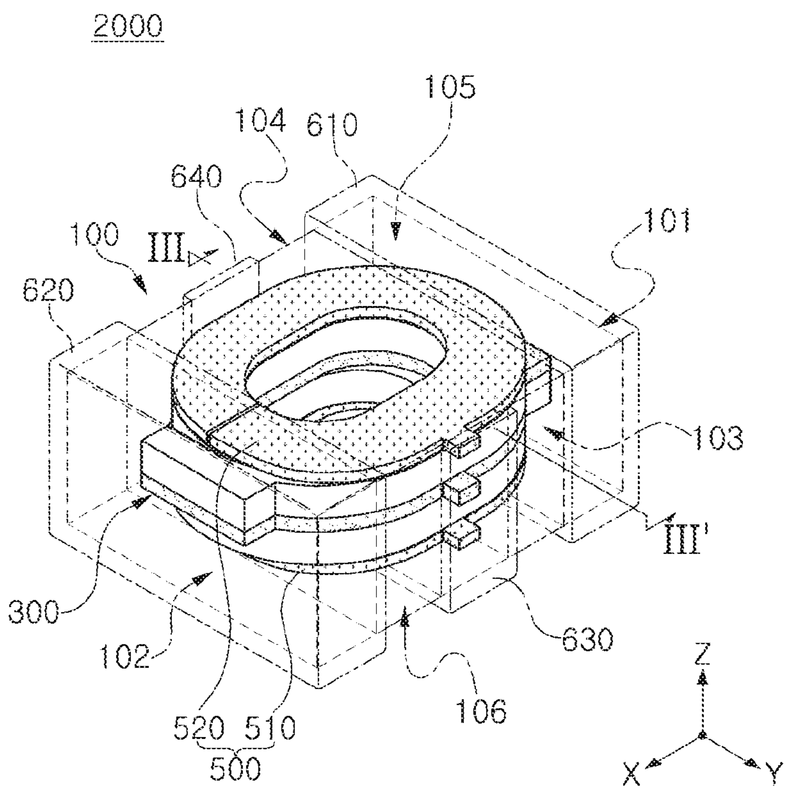
FIG. 11 is a schematic diagram illustrating a coil component according to a second example embodiment.
Figure 12:
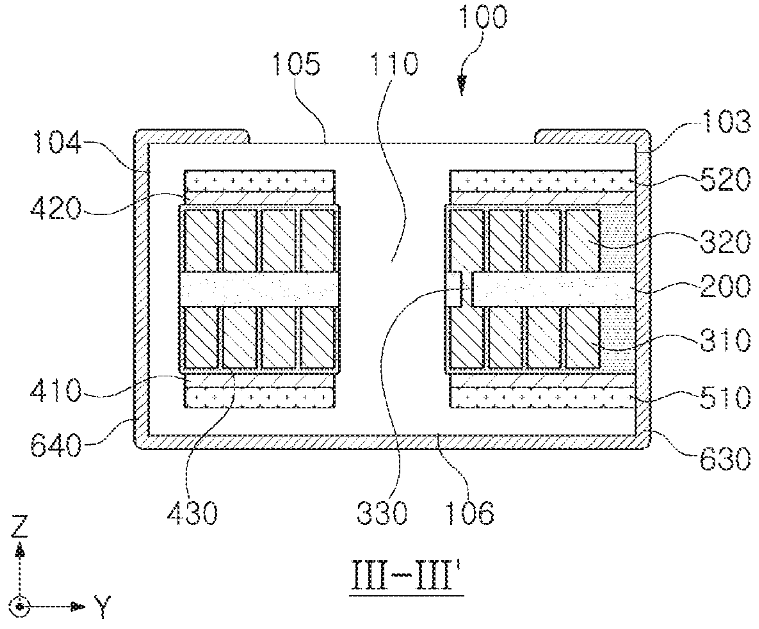
FIG. 12 is a cross-sectional diagram taken along line III-III' in FIG. 11.

FIG. 11 is a schematic diagram illustrating a coil component according to a second example embodiment. FIG. 12 is a cross-sectional diagram taken along line III-III' in FIG. 11. To clearly illustrate the coupling between the other elements, an insulating applied to the example embodiment is not illustrated in FIG. 11.

In the coil component 2000 in the example embodiment, shapes of the third and fourth external electrodes 630 and 640 may be different from those of the third and fourth external electrodes 630 and 640 in the coil component 1000 described in the first example embodiment. Thus, in the description of the example embodiment, only the third and fourth external electrodes 630 and 640 different from those of the first example embodiment will be described. The descriptions of the first example embodiment may also be applied to the other elements of the example embodiment.

Figure 13:
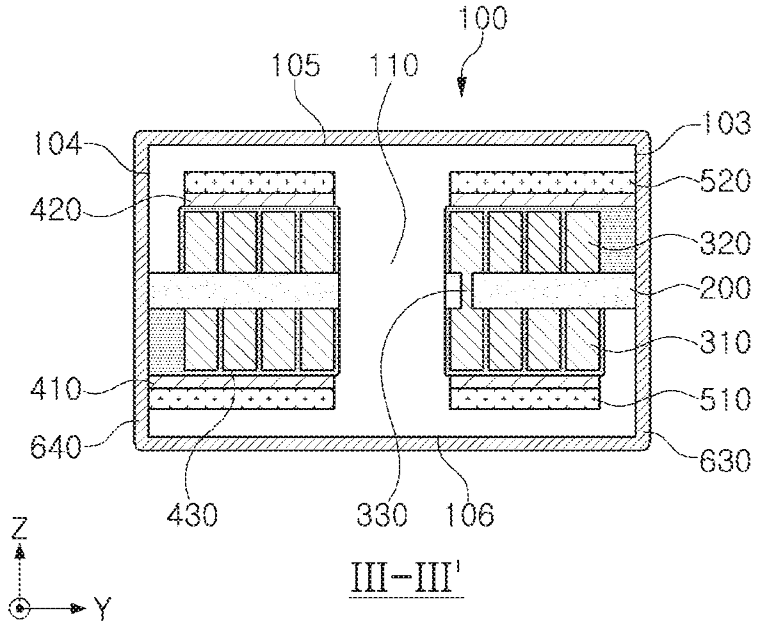
FIG. 13 is a schematic diagram illustrating a coil component according to a first modified example of the second example embodiment, corresponding to the cross-sectional surface taken along line III-III' in FIG. 11.

Referring to FIGS. 11 to 13, the third and fourth external electrodes 630 and 640 may be connected to each other on the sixth surface 106 of the body 100.

For example, an end portion of the third external electrode 630 extending to the sixth surface 106 of the body 100 may be in contact with and connected to an end portion of the fourth external electrode 640 extending to the sixth surface 106 of the body 100. When the coil component 2000 is mounted on a mounting substrate such as a printed circuit board, the sixth surface 106 of the body 100 may become amounting surface. A plurality of signal pads and a plurality of ground pads may be formed on a surface of the mounting substrate to be connected to components, and in the example embodiment, by configuring the third and fourth external electrodes 630 and 640 to be connected to each other on the sixth surface 106 of the body 100, a ground pad on the mounting substrate may be easily connected to the noise removing patterns 510 and 520. Accordingly, the mounting process may be easily performed.

FIG. 13 is a schematic diagram illustrating a coil component according to a first modified example of the second example embodiment, corresponding to the cross-sectional surface taken along line III-III' in FIG. 11.

Referring to FIG. 13, the third and fourth external electrodes 630 and 640 applied to the modified example may be configured to surround the third, sixth, fourth, and fifth surfaces 103, 106, 104, and 105 of the body 100. In the modified example, the third and fourth external electrodes 630 and 640 connected to the noise removing patterns 510 and 520 may be easily formed on a surface of the body 100. In other words, the third and fourth external electrodes 630 and 640 may be easily formed by a printing method such as a screen printing method, or the like. Alternatively, even when the third and fourth external electrodes 630 and 640 are formed by a plating method, by relatively simply patterning plating resist, the third and fourth external electrodes 630 and 640 may be easily formed.

Although not illustrated in the diagram, the example embodiment may also be modified the same as the modified examples of the first example embodiment.

Third Example Embodiment

Figure 14:
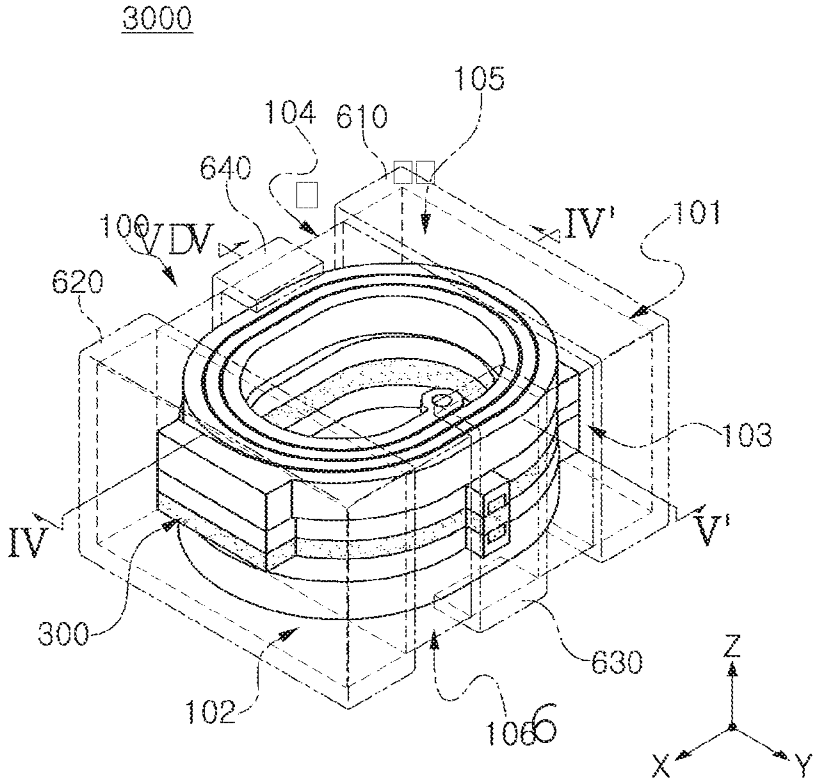
FIG. 14 is a schematic diagram illustrating a coil component according to a third example embodiment.
Figure 15:
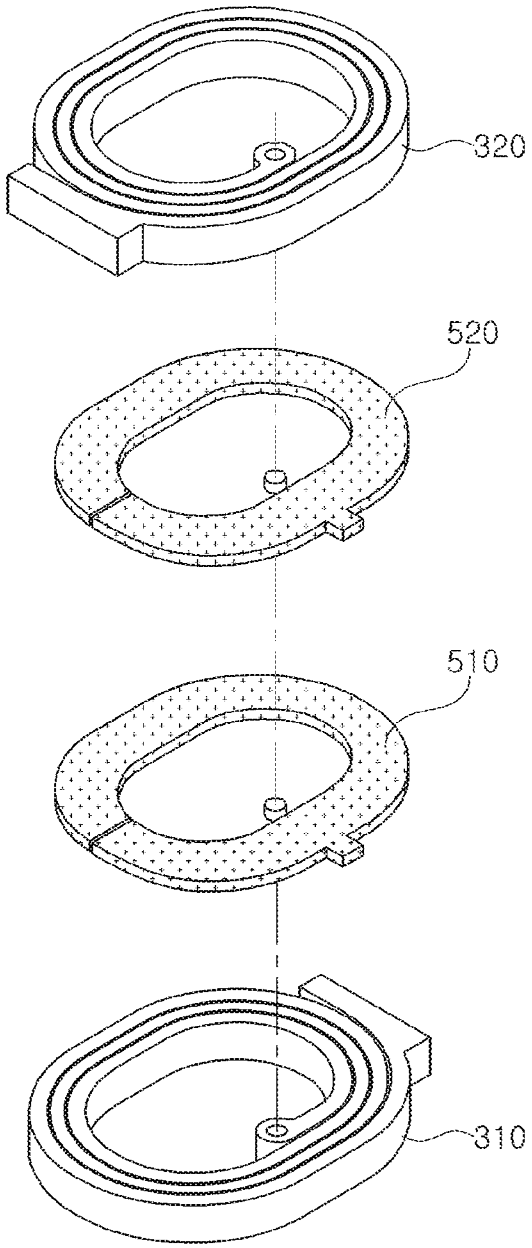
FIG. 15 is a schematic diagram illustrating a connection relationship among a support substrate, a coil portion, and a noise removal portion, applied to the third example embodiment.
Figure 16:
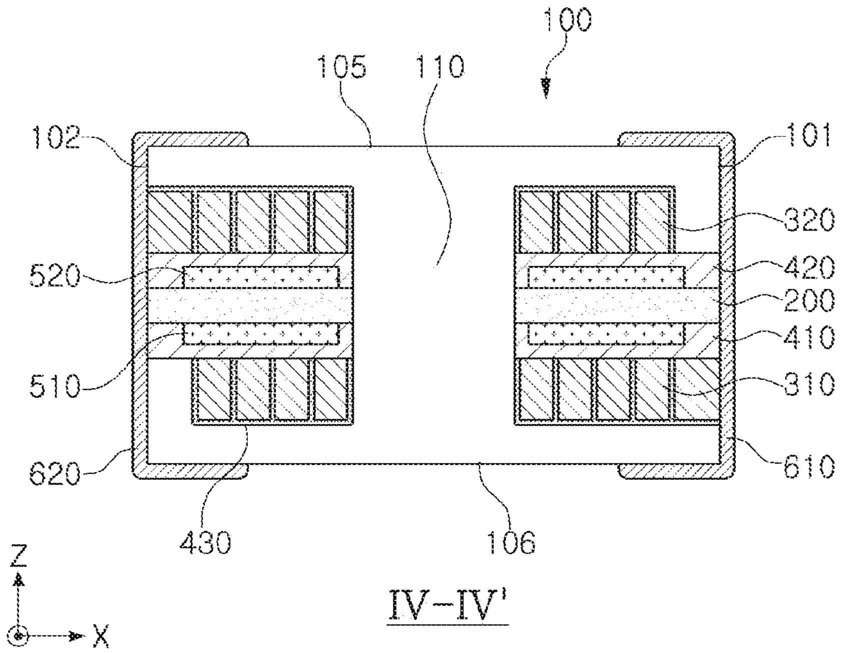
FIG. 16 is a schematic diagram illustrating a coil component according to the third example embodiment, corresponding to the cross-sectional surface taken along line IV-IV' in FIG. 14.
Figure 17:
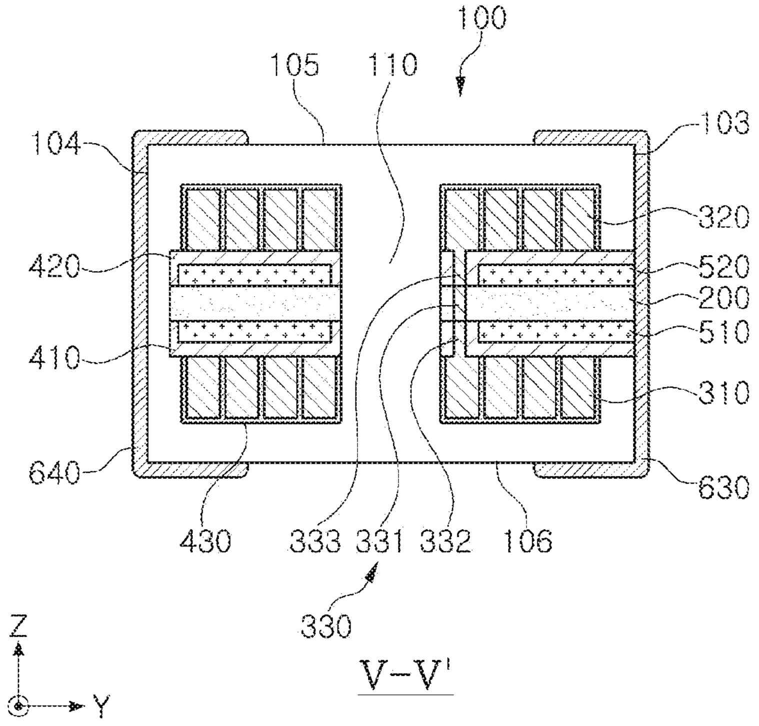
FIG. 17 is a schematic diagram illustrating a coil component according to the third example embodiment, corresponding to the cross-sectional surface taken along line V-V' in FIG. 14.

FIG. 14 is a schematic diagram illustrating a coil component according to a third example embodiment. FIG. 15 is a schematic diagram illustrating a connection relationship among a support substrate, a coil portion, and a noise removal portion, applied to the third example embodiment. FIG. 16 is a schematic diagram illustrating a coil component according to the third example embodiment, corresponding to the cross-sectional surface taken along line IV-IV' in FIG. 14. FIG. 17 is a schematic diagram illustrating a coil component according to the third example embodiment, corresponding to the cross-sectional surface taken along line V-V' in FIG. 14.

To clearly illustrate the coupling between the other elements, an insulating layer applied to the example embodiment is not illustrated.

In the coil component 3000 in the example embodiment, a dispositional relationship between the coil portion 300 and the noise removal portion 500 may be different from the dispositional relationship between the coil portion 300 and the noise removal portion 500 in the coil component 1000 described in the first example embodiment. Thus, in the description of the example embodiment, only the dispositional relationship between the coil portion 300 and the noise removal portion 500 different from the example described in the first example embodiment will be described. The descriptions of the first example embodiment may be applied to the other elements of the example embodiment.

Referring to FIGS. 14 to 17, the noise removal portion 500 applied to the example embodiment may be disposed between the coil portion 300 and the support substrate 200.

Referring to FIGS. 14 to 17, a first additional insulating layer 410 may be disposed on one surface of the support substrate 200 and a second additional insulating layer 420 may be disposed on the other surface of the support substrate 200. The first noise removing pattern 510 may be formed on one surface of the support substrate 200 and may be disposed within the first additional insulating layer 410, and the second noise removing pattern 520 may be formed on the other surface of the support substrate 200 may be disposed within the second additional insulating layer 420. An insulating film 430 may be disposed along surfaces of the support substrate 200, the first and second additional insulating layers 410 and 420, and the coil portion 300 and may be disposed between the coil portion 300 and the body 100. For example, the first noise removing pattern 510 may be in contact with and formed on a lower surface of the support substrate 200, the first coil pattern 310 may be disposed on the first noise removing pattern 510, and the first additional insulating layer 410 may be disposed between the first noise removing pattern 510 and the first coil pattern 310 and may electrically insulate the first noise removing pattern 510 from the first coil pattern 310. The second noise removing pattern 520 may be in contact with and formed on an upper surface of the support substrate 200, the second coil pattern 320 may be disposed on the second noise removing pattern 520, and the second additional insulating layer 420 may be disposed between the second noise removing pattern 520 and the second coil pattern 320 and may electrically insulate the second noise removing pattern 520 and the second coil pattern 320 from each other. A via 330 connecting the first and second coil patterns 310 and 320 to each other may include a first via 331 penetrating the support substrate 200, a second via 332 penetrating the first additional insulating layer 410, and a third via 333 penetrating the second additional insulating layer 420. The second and third vias 332 and 333 may penetrate the first and second additional insulating layers 410 and 420 and may be in contact with and connected to both end portions of the first via 331. Also, the second and third vias 332 and 333 may be spaced apart from the first and second noise removing patterns 510 and 520, respectively.

The first to third vias 331, 332, and 333 may be formed in different processes such that a boundary may be formed among the elements. Alternatively, the first to third vias 331, 332, and 333 may be formed in the same process and may be integrated with each other. When the first to third vias 331, 332, and 333 are formed in different processes, the second via 332 penetrating the first additional insulating layer 410 may be configured to cover one end of the first via 331 penetrating the support substrate 200. The third via 333 penetrating the second additional insulating layer 420 may be configured to cover the other end of the first via 331 penetrating the support substrate 200. Accordingly, seed layers of the second and third vias 332 and 333 may be interposed among electrolytic plating layers of the first to third vias 331, 332, and 333 such that a boundary may be formed among the electrolytic plating layers of the first to third vias 331, 332, and 333. When the first to third vias 331, 332, and 333 are formed in the same process, a seed layer may be formed on an internal wall of a via hole penetrating the support substrate 200 and the second additional insulating layer 420 and an electrolytic plating layer may fill the via hole. In this case, the first to third vias 331, 332, and 333 may be distinguished from one another by a dispositional area, rather than being distinguished by interfacial surfaces among the first to third vias 331, 332, and 333. In both of the examples in which the first to third vias 331, 332, and 333 are formed in the different process or in the same process, a seed layer and an electrolytic plating layer of the second via 332 may be integrated with a seed layer and an electrolytic plating layer of the first coil pattern 310, respectively, but an example embodiment thereof is not limited thereto. Similarly, a seed layer and an electrolytic plating layer of the third via 333 may be integrated with a seed layer and an electrolytic plating layer of the second coil pattern 320, respectively, but an example embodiment thereof is not limited thereto.

FIG. 17 illustrates the example in which diameters of the second and third vias 332 and 333 are the same in upper and lower portions thereof, but an example embodiment thereof is not limited thereto. As an example, although not limited thereto, the second and third vias 332 and 333 may be formed such that diameters thereof may decrease in a direction from one surfaces of the first and second additional insulating layers 410 and 420 in contact with the first and second coil patterns 310 and 320 towards the other surfaces of the first and second additional insulating layers 410 and 420 in contact with the support substrate 200. Also, FIG. 17 illustrates the example in which both end portions of the first via 331 taken in a thickness direction Z of the body 100 are directly in contact with one ends of the second and third vias 332 and 333, respectively, but an example embodiment thereof is not limited thereto. As an example, although not limited thereto, via pads spaced apart from the first and second noise removing patterns 510 and 520 may be formed on both surfaces of the support substrate 200, and the first to third vias 331, 332, and 333 may be in contact with via pads, respectively, and may be connected to each other through the via pads. When the via pad is formed, connection reliability among the first to third vias 331, 332, and 333 may be secured. A diameter of the via pad may be greater than a diameter of each of end portions of the second and third vias, but an example embodiment thereof is not limited thereto. Further, FIG. 17 illustrates the example in which centers of the first to third vias 331, 332, and 333 match one another, but an example embodiment thereof is not limited thereto. The via 330 may also have a form of staggered vias such that centers of the first to third vias 331, 332, and 333 do not match or directly align with each other.

Figure 18:
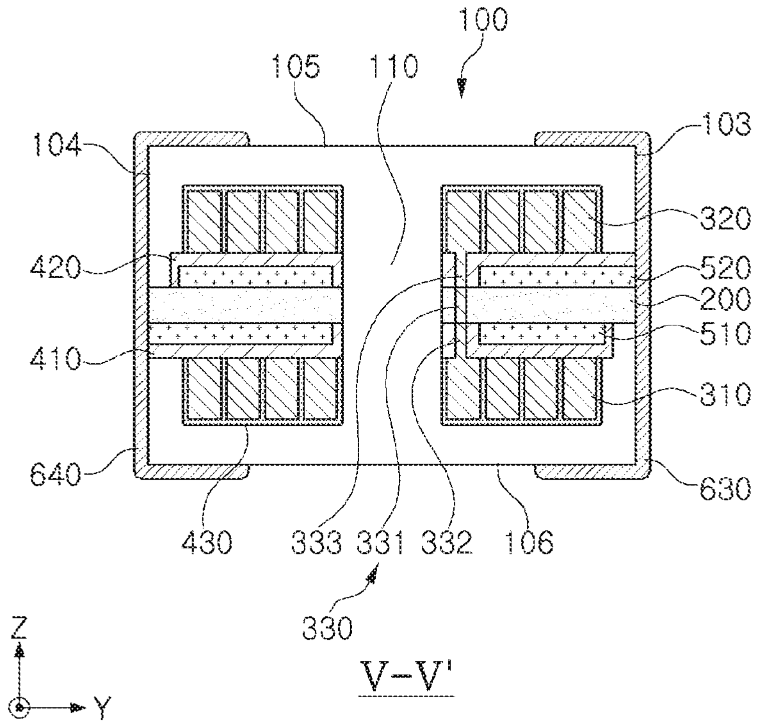
FIG. 18 is a schematic diagram illustrating a coil component according to a first modified example of the third example embodiment, corresponding to the cross-sectional surface taken along line V-V' in FIG. 14.

FIG. 18 is a schematic diagram illustrating a coil component according to a modified example of the third example embodiment, corresponding to the cross-sectional surface taken along line V-V' in FIG. 14.

Referring to FIG. 18, in the modified example of the third example embodiment, a fourth lead-out portion of a first noise removing pattern 510 may be exposed to the fourth surface 104 of the body 100, and a third lead-out portion of a second noise removing pattern 520 may be exposed to the third surface 103 of the body 100. The fourth lead-out portion of the first noise removing pattern 510 may be in contact with and connected to a fourth external electrode 640 disposed on the fourth surface 104 of the body 100, and the third lead-out portion of the second noise removing pattern 520 may be in contact with and connected to the third external electrode 630 disposed on the third surface 103 of the body 100. Thus, in the example embodiment, even when one of the third and fourth external electrodes 630 and 640 is disconnected from a mounting substrate, noise may be removed.

In the example embodiment, differently from the aforementioned example embodiments, the noise removal portion 500 may be preferentially formed on the support substrate 200, and the coil portion 300 may be formed on the noise removal portion 500. As the coil portion 300 has a relatively high aspect ratio, even when the insulating layers 410 and 420 are disposed on the coil portion 300 (e.g., as in FIGS. 1-6), it may be difficult to uniformly form surfaces of the insulating layers 410 and 420, and accordingly, it may be difficult to form the noise removal portion 500 on the insulating layers 410 and 420. In the example embodiment, by preferentially forming the noise removal portion 500 having a relatively simpler pattern shape and having a low aspect ratio on the support substrate 200 (e.g., as in FIGS. 14-17), the above-described issue may be addressed.

Although not illustrated in the diagram, the example embodiment may also be modified the same as the modified examples of the first example embodiment.

Fourth Example Embodiment and Modified Examples Thereof

Figure 19:
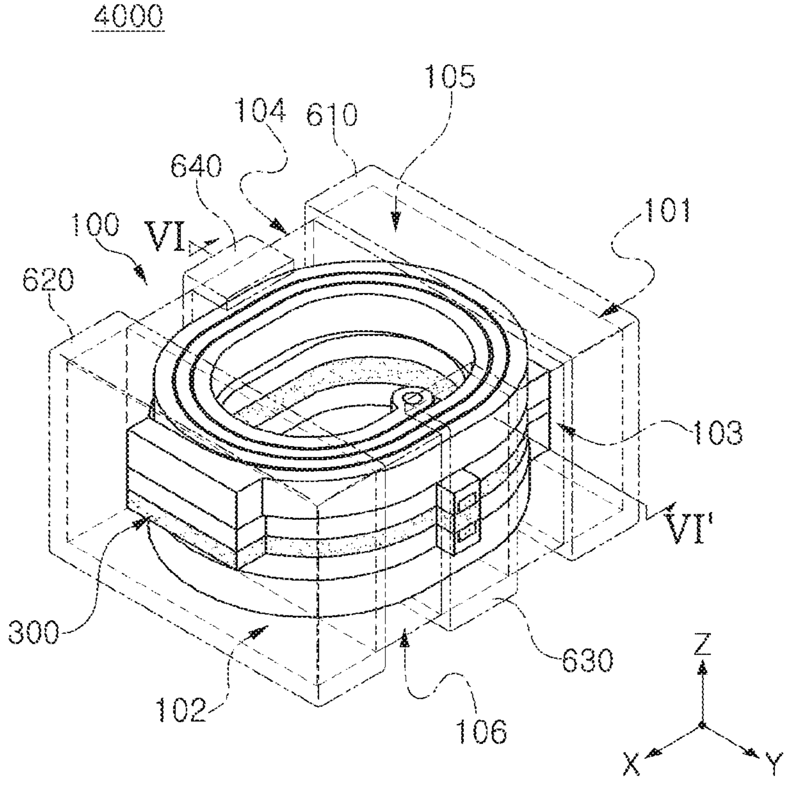
FIG. 19 is a schematic diagram illustrating a coil component according to a fourth example embodiment.
Figure 20:
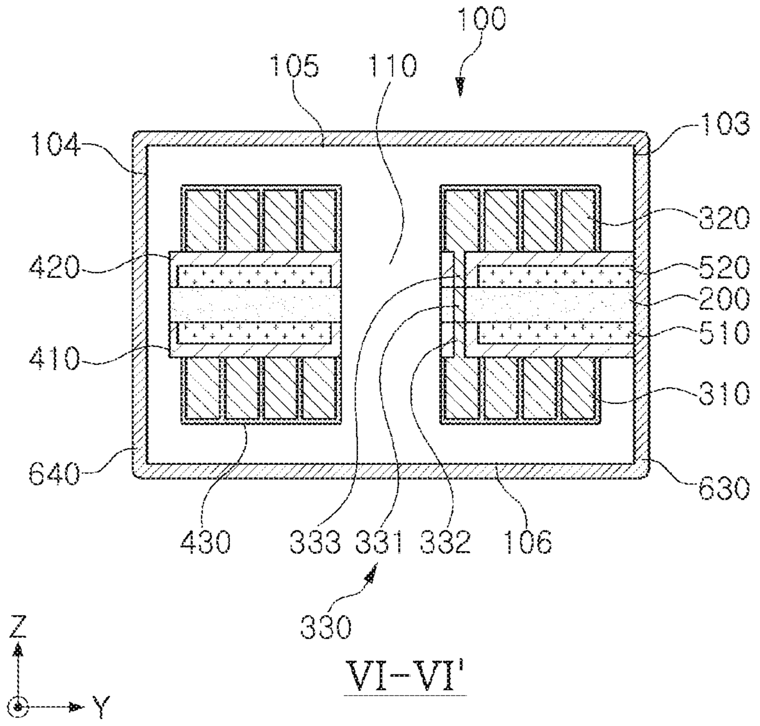
FIG. 20 is a schematic diagram illustrating a coil component according to the fourth example embodiment, corresponding to the cross-sectional surface taken along line VI-VI' in FIG. 19.

FIG. 19 is a schematic diagram illustrating a coil component according to a fourth example embodiment. FIG. 20 is a schematic diagram illustrating a coil component according to the fourth example embodiment, corresponding to the cross-sectional surface taken along line VI-VI' in FIG. 19.

To clearly illustrate the coupling between the other elements, FIG. 19 does not illustrate an insulating layer applied to the example embodiment.

In a coil component 4000 in the example embodiment, shapes of the third and fourth external electrodes 630 and 640 may be different from the shapes of the third and fourth external electrodes 630 and 640 in the coil component 3000 described in the third example embodiment. Thus, in the description of the example embodiment, only the third and fourth external electrodes 630 and 640 different from those of the third example embodiment will be described. The descriptions of the third example embodiment may be applied to the other elements of the example embodiment.

Referring to FIGS. 19 and 20, the third and fourth external electrodes 630 and 640 applied to the example embodiment may be connected to each other on the sixth surface 106 of the body 100.

For example, an end portion of the third external electrode 630 extending to the sixth surface 106 of the body 100 may be in contact with and connected to an end portion of the fourth external electrode 640 extending to the sixth surface 106 of the body 100. When the coil component 4000 in the example embodiment is mounted on amounting substrate such as a printed circuit board, or the like, the sixth surface 106 of the body 100 may be a mounting surface. A plurality of signal pads and a plurality of ground pads may be formed on a surface of the mounting substrate to be connected to components, and in the example embodiment, by configuring the third and fourth external electrodes 630 and 640 to be connected to each other on the sixth surface 106 of the body 100, a ground pad on the mounting substrate may be easily connected to the noise removing patterns 510 and 520. Accordingly, the mounting process may be easily performed.

FIG. 21 is a schematic diagram illustrating a coil component according to a first modified example of the fourth example embodiment, corresponding to the cross-sectional surface taken along line VI-VI' in FIG. 19.

Referring to FIG. 21, the third and fourth external electrodes 630 and 640 applied to the modified example may be configured to surround the third, sixth, fourth, and fifth surfaces 103, 106, 104, and 105 of the body 100. In the modified example, the third and fourth external electrodes 630 and 640 connected to the noise removing patterns 510 and 520 may be easily formed on a surface of the body 100. In other words, the third and fourth external electrodes 630 and 640 may be easily formed by a printing method such as a screen printing method, or the like. Alternatively, even when the third and fourth external electrodes 630 and 640 are formed by a plating method, by relatively simply patterning plating resist, the third and fourth external electrodes 630 and 640 may be easily formed.

Although not illustrated in the diagram, the example embodiment may also be modified the same as the modified examples of the third example embodiment.

According to the aforementioned example embodiments, by reducing a path in which a high frequency noise is removed up to the external electrode, noise may be easily removed.

While the exemplary embodiments have been shown and described above, it will be apparent to those skilled in the art that modifications and variations could be made without departing from the scope of the present invention as defined by the appended claims.

What is claimed is:

1. A coil component, comprising:

a body having one surface and another surface opposing each other, one side surface and another side surface connecting the one surface to the other surface and opposing each other, and one end surface and another end surface connecting the one side surface to the other side surface and opposing each other;

a support substrate disposed within the body;

a coil portion disposed on the support substrate, and having first and second lead-out portions exposed to the one end surface and the other end surface of the body, respectively;

a noise removal portion disposed within the body and spaced apart from the coil portion, and including a pattern portion having an open loop and having a slit between one end portion thereof and another end portion thereof spaced apart from each other, and a third lead-out portion connected to the pattern portion and having one surface exposed to the one side surface of the body;

an insulating layer disposed between the coil portion and the noise removal portion; and first, second, and third external electrodes respectively disposed on the one end surface, the other end surface, and the one side surface of the body, and respectively connected to the first, second, and third lead-out portions.

2. The coil component of claim 1, wherein the slit is disposed closer to the other side surface of the body than to the one side surface of the body.

3. The coil component of claim 1, wherein the pattern portion has a turn overlapping with a turn of the coil portion, and the slit is disposed at a position between ¼ turn or greater and ¾ turn or less of the turn of the pattern portion in a clockwise direction from the third lead-out portion.

4. The coil component of claim 3, wherein the slit is disposed at a position of a ½ turn of the pattern portion in the clockwise direction from the third lead-out portion.

5. The coil component of claim 1, wherein a first virtual surface crosses a center of the open loop and a center of one surface of the third lead-out portion, a second virtual surface is perpendicular to the first virtual surface and crosses a center of the open loop, a first region of the noise removal portion is disposed on one side of the second virtual surface including the third lead-out portion, a second region of the noise removal portion is disposed on another side of the second virtual surface relative to the first region, and at least one of the one end portion or the other end portion of the pattern portion is disposed within the second region.

6. The coil component of claim 5, wherein a third virtual surface crosses a center of a spacing between the one end portion and the other end portion of the pattern portion and the center of the open loop, and an angle measured in a clockwise direction between the first virtual surface disposed within the first region and the third virtual surface is 90° or greater and 270° or less.

7. The coil component of claim 1, wherein the slit is parallel to a direction in which the third lead-out portion extends from the pattern portion.

8. The coil component of claim 1, wherein the coil portion includes first and second coil patterns disposed on respective opposing surfaces of the support substrate, and each having a planar spiral shape, and the noise removal portion includes first and second noise removing patterns respectively disposed on the first and second coil patterns, and each having an open loop.

9. The coil component of claim 8, wherein the insulating layer includes an insulating film disposed along surfaces of the support substrate and the coil portion and disposed between the coil portion and the noise removal portion.

10. The coil component of claim 9, wherein the insulating layer further includes an additional insulating layer disposed between the insulating film and the noise removal portion.

11. The coil component of claim 8, wherein the insulating layer further includes an additional insulating layer disposed along surfaces of the support substrate, the coil portion, and the noise removal portion and disposed between the coil portion and the noise removal portion, and an insulating film disposed between the noise removal portion and the body.

12. The coil component of claim 1, wherein the insulating layer includes a first additional insulating layer disposed on one surface of the support substrate, and a second additional insulating layer disposed on another surface opposing the one surface of the support substrate, the coil portion includes first and second coil patterns respectively disposed on the first and second additional insulating layers, and each having a planar spiral shape, and the noise removal portion includes a first noise removing pattern disposed on one surface of the support substrate and disposed within the first additional insulating layer, and a second noise removing pattern disposed on the other surface of the support substrate opposing the one surface and disposed within the second additional insulating layer.

13. The coil component of claim 12, wherein the insulating layer further includes an insulating film disposed along surfaces of the support substrate, the first and second additional insulating layers, and the coil portion and disposed between the coil portion and the body.

14. The coil component of claim 8, wherein the second noise removing pattern includes the third lead-out portion connected to the pattern portion and exposed to the one side surface of the body, and wherein the first noise removing pattern includes a fourth lead-out portion connected to the pattern portion.

15. The coil component of claim 14, further comprising:

a fourth external electrode disposed on the other side surface of the body and spaced apart from the first to third external electrodes, wherein the fourth lead-out portion is exposed to the one side surface of the body and is connected to the third external electrode.

16. The coil component of claim 15, wherein the third external electrode is in contact with and connected to the fourth external electrode on the one surface of the body.

17. The coil component of claim 14, further comprising:

a fourth external electrode disposed on the other side surface of the body and spaced apart from the first, second, and third external electrodes, wherein the third lead-out portion of the second noise removing pattern is connected to the third external electrode, and wherein a fourth lead-out portion of the first noise removing pattern is connected to the fourth external electrode.

18. The coil component of claim 17, wherein the third external electrode is in contact with and connected to the fourth external electrode on one surface of the body.

19. The coil component of claim 1, wherein a distance from the other end portion of the pattern portion to the one side surface of the body is the same as or greater than a distance from the one end portion of the pattern portion to the other side surface of the body.

20. A coil component comprising:

a body;

a support substrate disposed within the body;

a coil portion disposed within the body and including a coil having a plurality of coplanar turns, disposed on a main surface of the support substrate, and first and second lead-out portions exposed to respective opposing end surfaces of the body; and a conductive pattern disposed within the body, having an open loop with opposing ends spaced apart from each other by a slit, and overlapping with each of the plurality of coplanar turns of the coil in a direction orthogonal to the main surface.

21. The coil component of claim 20, wherein a width, measured in a direction parallel to the main surface of the support substrate, of a conductive pattern trace having the open loop of the conductive pattern is greater than a width of each coil turn of the plurality of coplanar turns of the coil.

22. The coil component of claim 20, further comprising a third lead-out portion electrically connected to the conductive pattern and extending therefrom to a surface of the body.

23. The coil component of claim 22, wherein the third lead-out portion is disposed at least ¼ turn of the open loop from the slit.

24. The coil component of claim 22, wherein a center of the third lead-out portion is disposed at an angle of 90° or greater and 270° or less, measured around a center of the coil, from a center of the slit.

25. The coil component of claim 20, wherein the conductive pattern is disposed between the support substrate and the coil, and is spaced apart from the coil by an insulating layer.

26. The coil component of claim 20, wherein the coil is disposed between the support substrate and the conductive pattern, and is spaced apart from the conductive pattern by an insulating layer.

27. A coil component comprising:

a body;

a support substrate disposed within the body;

a coil portion disposed within the body and including a coil, disposed on a main surface of the support substrate, and first and second lead-out portions exposed to respective opposing end surfaces of the body; and a conductive pattern portion disposed within the body, having an open loop with opposing ends spaced apart from each other by a slit, and overlapping with the coil of the coil portion in a direction orthogonal to the main surface, wherein only a single lead-out portion is connected to the conductive pattern portion and extends to a surface of the body.

28. The coil component of claim 27, wherein the single lead-out portion connected to the conductive pattern portion extends to a surface of the body other than the opposing end surfaces of the body to which the first and second lead-out portions are exposed.

29. The coil component of claim 27, wherein the single lead-out portion is disposed at least ¼ turn of the open loop from the slit.

30. The coil component of claim 27, wherein a center of the single lead-out portion is disposed at an angle of 90° or greater and 270° or less, measured around a center of the coil, from a center of the slit.

31. The coil component of claim 27, wherein the slit is disposed further from the surface of the body to which the single lead-out portion extends than to another surface of the body opposite the surface of the body to which the single lead-out portion extends.

32. The coil component of claim 27, wherein the conductive pattern portion is disposed between the support substrate and the coil, and is spaced apart from the coil by an insulating layer.

33. The coil component of claim 27, wherein the coil is disposed between the support substrate and the conductive pattern portion, and is spaced apart from the conductive pattern portion by an insulating layer.

* * * * *